(12) United States Patent
Faust et al.

(10) Patent No.: US 11,694,869 B2
(45) Date of Patent: Jul. 4, 2023

(54) EVALUATING A CONTACT BETWEEN A WAFER AND AN ELECTROSTATIC CHUCK

(71) Applicant: APPLIED MATERIALS ISRAEL LTD., Rehovot (IL)

(72) Inventors: Adam Faust, Rehovot (IL); Yosef Basson, Mazkeret-Batya (IL); Guy Eytan, Kidron (IL); Yonathan David, Yavne (IL)

(73) Assignee: Applied Materials Israel Ltd., Rehovot (IL)

( * ) Notice: Subject to any disclaimer, the term of this patent is extended or adjusted under 35 U.S.C. 154(b) by 330 days.

(21) Appl. No.: 17/115,656

(22) Filed: Dec. 8, 2020

(65) Prior Publication Data

US 2022/0181115 A1    Jun. 9, 2022

(51) Int. Cl.

| | |
|---|---|
| *H01J 37/20* | (2006.01) |
| *H01L 21/683* | (2006.01) |
| *H01L 21/67* | (2006.01) |
| *G01N 27/04* | (2006.01) |
| *H01J 37/28* | (2006.01) |

(52) U.S. Cl.
CPC ............ *H01J 37/20* (2013.01); *G01N 27/041* (2013.01); *H01J 37/28* (2013.01); *H01L 21/67259* (2013.01); *H01L 21/6831* (2013.01)

(58) Field of Classification Search
CPC .... H01J 37/20; H01J 37/28; H01J 2237/2007; G01N 27/041; G01N 27/60; G01N 23/2251; G01N 33/00; G01N 2223/079; G01N 2223/303; H01L 21/67259; H01L 21/6831; H01L 21/67253; H01L 21/6833; G01R 29/24
See application file for complete search history.

(56) References Cited

U.S. PATENT DOCUMENTS

| | | | |
|---|---|---|---|
| 6,847,014 B1* | 1/2005 | Benjamin | ......... H01L 21/67103 219/544 |
| 9,664,721 B1* | 5/2017 | Noras | ...................... G01P 3/665 |
| 2006/0094218 A1* | 5/2006 | Sheen | ................. C23C 16/4586 257/E21.279 |

(Continued)

FOREIGN PATENT DOCUMENTS

KR    20150070712 A   *   6/2015  ............. H01L 22/30

*Primary Examiner* — Jermele M Hollington
*Assistant Examiner* — Zannatul Ferdous
(74) *Attorney, Agent, or Firm* — Kilpatrick Townsend & Stockton LLP

(57) ABSTRACT

A method, a non-transitory computer readable medium and a device. The method may include (a) introducing a voltage difference between an absolute value of a negative pole of the electrostatic chuck and an absolute value of a positive pole of the electrostatic chuck, the introducing occurs while the wafer is supported by the electrostatic chuck and is contacted by one or more conductive contact pins of the electrostatic chuck; (b) monitoring, by an electrostatic sensor that comprises a sensing element, a charge at a point of measurement located at a front side of the wafer, at different points of time that follow a start of the introducing of the voltage difference, to provide monitoring results; and (c) determining an electrical parameter of the contact between the wafer and the electrostatic chuck, based on the monitoring results.

22 Claims, 9 Drawing Sheets

(56) References Cited

U.S. PATENT DOCUMENTS

| | | | |
|---|---|---|---|
| 2007/0091541 A1* | 4/2007 | Buchberger | H01L 21/67069 361/234 |
| 2012/0145323 A1* | 6/2012 | Tamura | H01J 37/32706 156/345.28 |
| 2013/0027062 A1* | 1/2013 | Inai | G06F 3/044 702/65 |
| 2013/0075605 A1 | 3/2013 | Krivts et al. | |

* cited by examiner

358

359

EVALUATING A CONTACT BETWEEN A WAFER AND AN ELECTROSTATIC CHUCK

BACKGROUND OF THE INVENTION

A wafer may be evaluated by an evaluation system such as but not limited to a scanning electron microscope (SEM).

Ideally, once supported by an electrostatic chuck, the front side of the wafer should be uniformly charged. In practice, the front side of the wafer may be unevenly charged. The uneven charge may introduce measurements errors. A typical measurement error may involve an unwanted deflection of an electron beam that scans the wafer.

The evaluation of the charge of the front side of the wafer should be done without contacting the wafer and without contaminating the wafer.

There is a growing need to provide a contactless and a contamination free method for evaluating the charging of the front side of the wafer.

A wafer may be supported by a mechanical stage, by an electrostatic chuck or by support elements. The support elements may not belong to the mechanical stage, and may not belong to the electrostatic chuck.

During the evaluation of the wafer, the wafer may be supported by the electrostatic chuck. The electrostatic chuck may be supported by the mechanical stage.

In various points in time (for example, following the evaluation of the wafer), the wafer may be moved away from the mechanical stage. In some cases, the wafer may be charged in a manner that the wafer will jump when the mechanical stage is far enough from the wafer. The jump may damage the wafer.

There is a growing need to predict the jump and even to prevent the jump.

The wafer, once supported by the electrostatic chuck, may be contacted by multiple pins that should ground the wafer. Due to various reasons, including insulating layers formed at the back side of the wafer, the grounding may fail.

There is a growing need to evaluate the quality of the contact between the wafer and the pins.

BRIEF SUMMARY OF THE INVENTION

Some embodiments of the invention pertain to a method, a non-transitory computer readable medium and a system for evaluating a contact between a wafer and an electrostatic chuck.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
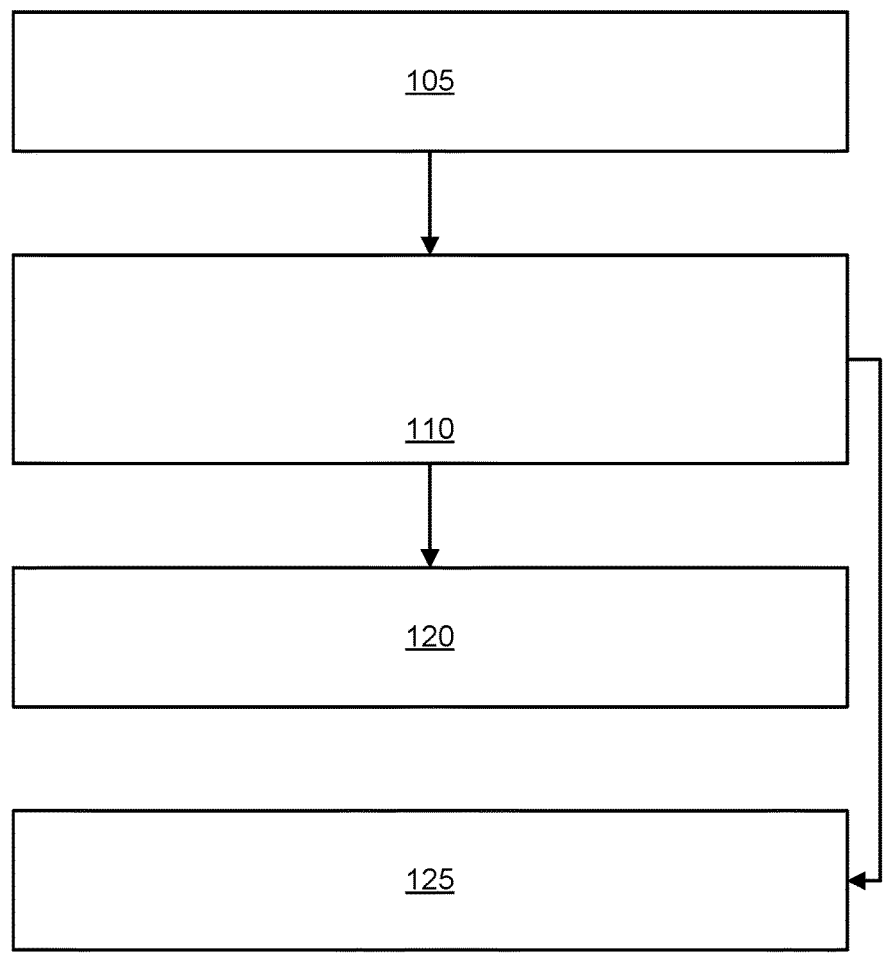
FIG. 1 illustrates an example of a method.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

There are provided methods, devices, and non-transitory computer readable medium that may use an electrostatic sensor.

The electrostatic sensor may include a sensing element. The sensing element may be a Kelvin probe—or may differ from a Kelvin probe. For simplicity of explanation the following text may relate to a Kelvin probe. Other types of electrostatic sensors may be used.

Evaluating a Charge Distribution of an Area of a Front Side of a Wafer

There may be provided a method for evaluating a charge distribution of an area of a front side of a wafer. The area may cover the entire wafer or only a part of the wafer. The method may be applied on multiple areas of the wafer.

The charge distribution may include the charge values at two or more points of the wafer, and, additionally or alternatively, the charge values between the two or more points of the wafer. The two or more points may form an array of points. The points may be distant from each other by a distance that is of a centimetric range (for example may range between 0.1 centimeter and 10 centimeters).

The distance may range below 0.1 centimeter and, additionally or alternatively, may exceed 10 centimeters. The points may be uniformly distributed over the area or may be non-uniformly distributed over the area.

A charged particle system is a system that is configured to evaluate a wafer (or a portion of the wafer), whereas the evaluating includes illuminating the wafer (or the portion of the wafer) with one or more charged particle beams—such as an electron beam. Non-limiting examples of a charged particle system include electron beam imagers, and electron microscopes such as but not limited to a scanning electron microscope.

The evaluating may include at least one out of defect review, inspection, metrology (for example critical dimension measurements), and the like.

For simplicity of explanation some of the drawings and text refer to a scanning electron microscope (SEM) such as a review SEM.

FIG. 1 illustrated method 100 for evaluating the charge distribution of the area.

Method 100 may start by initialization step 105.

Initialization step 105 may include placing the wafer on an electrostatic chuck of a charged particle system.

Step 105 may be followed by step 110 of evaluating the charge distribution using an electrostatic sensor.

The electrostatic sensor includes a sensing element that is sealed from an inner space of a vacuumed chamber of the charged particle system. The sealing prevents contamination of the inner space by the sensing element.

The sensing element may be a movable Kelvin probe. The Kelvin probe may be moved between different positions during a charge measurement. The movement may include vibration, oscillation, and the like.

Step 110 may include performing charge measurements at different locations within the area.

The charge measurements may involve performing voltage measurements at a certain location within the area by moving (for example vibrating and, additionally or alternatively, oscillating) the movable Kelvin probe. The movement are relatively small—for example of few millimeters. The voltage measurements are indicative of the charge of the certain point.

At the certain location, the Kelvin probe may be moved along any path. The path may be horizontal, may be vertical, may be oblique, may be curved, and the like.

At the certain location, the Kelvin probe may be moved between a first position to a second position. When in the first position the Kelvin probe may be masked thereby prevented from sensing a voltage of the area. When in the second position the Kelvin probe is unmasked.

The measuring (at a certain location) is followed by (a) moving at least one of the wafer and the electrostatic sensor so that the electrostatic sensor faces another location and (b) performing the voltage measurements of the other location.

The number of measurement and moving iterations may exceed two.

The moving may be executed by a mechanical stage that moves the wafer within the vacuumed chamber.

The mechanical stage may receive the wafer from another mechanical unit—such as a robot or another mechanical unit that is used to move the wafer between a load lock of the charged particle system and the vacuumed chamber.

Step 110 is followed by step 120 of evaluating the area. The may include defect review of suspected defects of the area, measuring critical dimensions of structural elements of the area, and the like.

Step 110 may also be followed by step 125 of determining at least one evaluation parameter based on the evaluated charge distribution of the area. The evaluation parameter may be a deflection scheme of the electron beam used for irradiating the wafer during the evaluation of the wafer. The deflection scheme may counter (or at least mitigate) the non-uniformity of charge distribution of the front side of the wafer.

Figure 2:
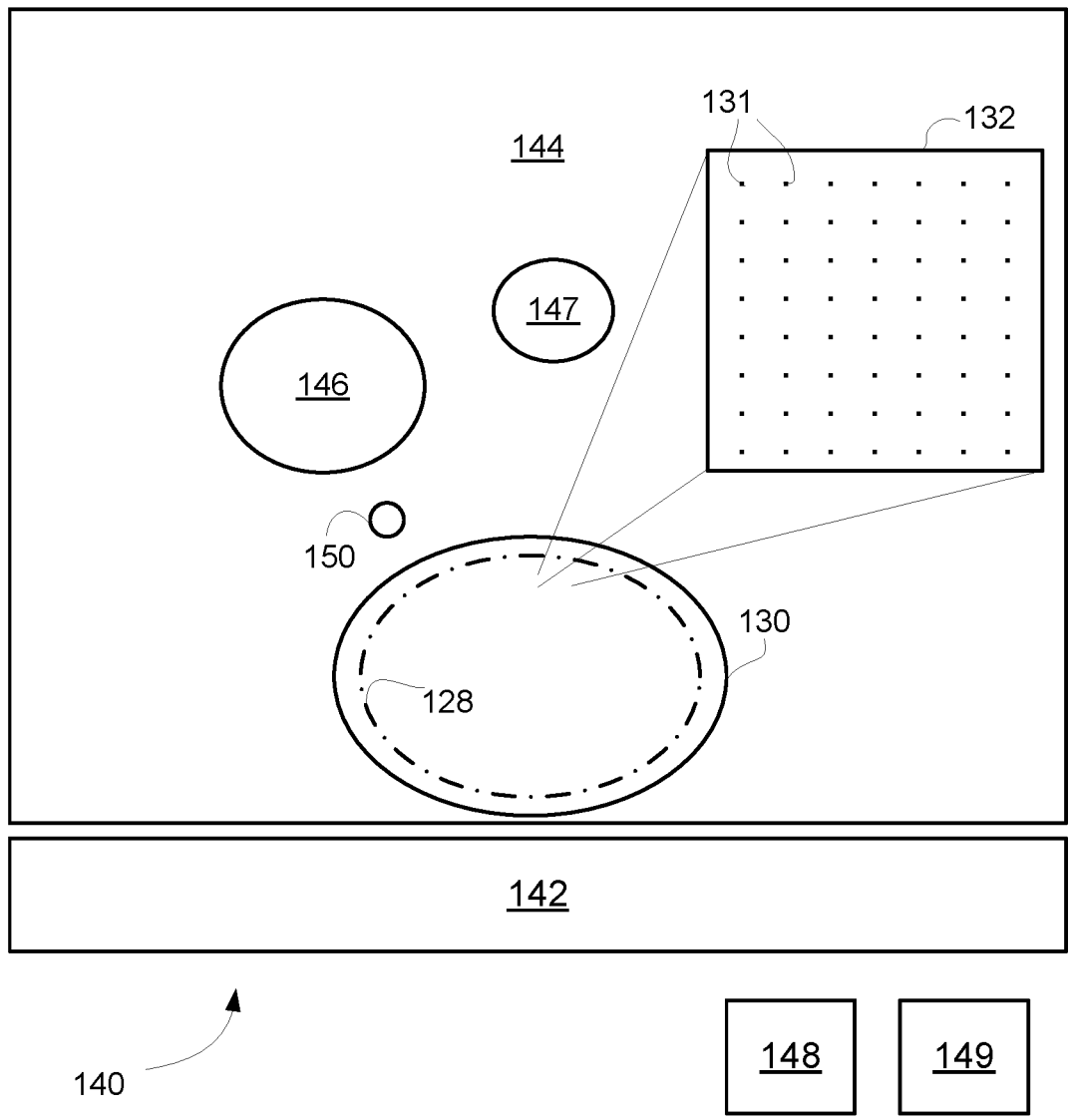
FIG. 2 illustrates an example of a wafer and a charged particle system.

FIG. 2 illustrates a wafer 130, and a charged particle system 140 that includes the electrostatic sensor 150, a load lock 142, an electrostatic chuck 128 (located below wafer 130), a vacuumed chamber 144, a charged particle column 146, an optical microscope 147, a processor 148, and a controller 149.

FIG. 2 also illustrates different points 131 of measurement located within area 132 of the wafer 130. The area may be of any shape (polygon, curves shape, circle, ellipse, and the like), and, additionally or alternatively, the area may be of any size.

Load lock 142 may be an interface between the charged particle system 140 and its environment. It may receive the wafers from cassettes of wafers connected to an interface.

A robotic arm (not shown) may move the wafer between the load lock 142 and the vacuumed chamber 144.

The charged particle column 146 may have a tip or a lower end and, additionally or alternatively, a lens that is located within the vacuumed chamber 144.

The electrostatic sensor 150 or at least a lower part of the electrostatic sensor 150 may be located within the vacuumed chamber 144. For example—the electrostatic sensor 150 may have a sensing element—such as a sensing probe that is sealed from the inner space of the vacuumed chamber—to prevent contamination.

The optical microscope 147 may view the wafer 130 through a window formed in the vacuumed chamber 144.

The wafer 130 may be supported by the electrostatic chuck 183, and the electrostatic chuck 183 may be moved by a mechanical stage (not shown) while in the vacuumed chamber.

The controller 149 is configured to control an operation of the charged particle system 140.

The processor 148 is configured to process the signals outputted from the electrostatic sensor 150 and may execute at least some stages of method 100.

Figure 3:
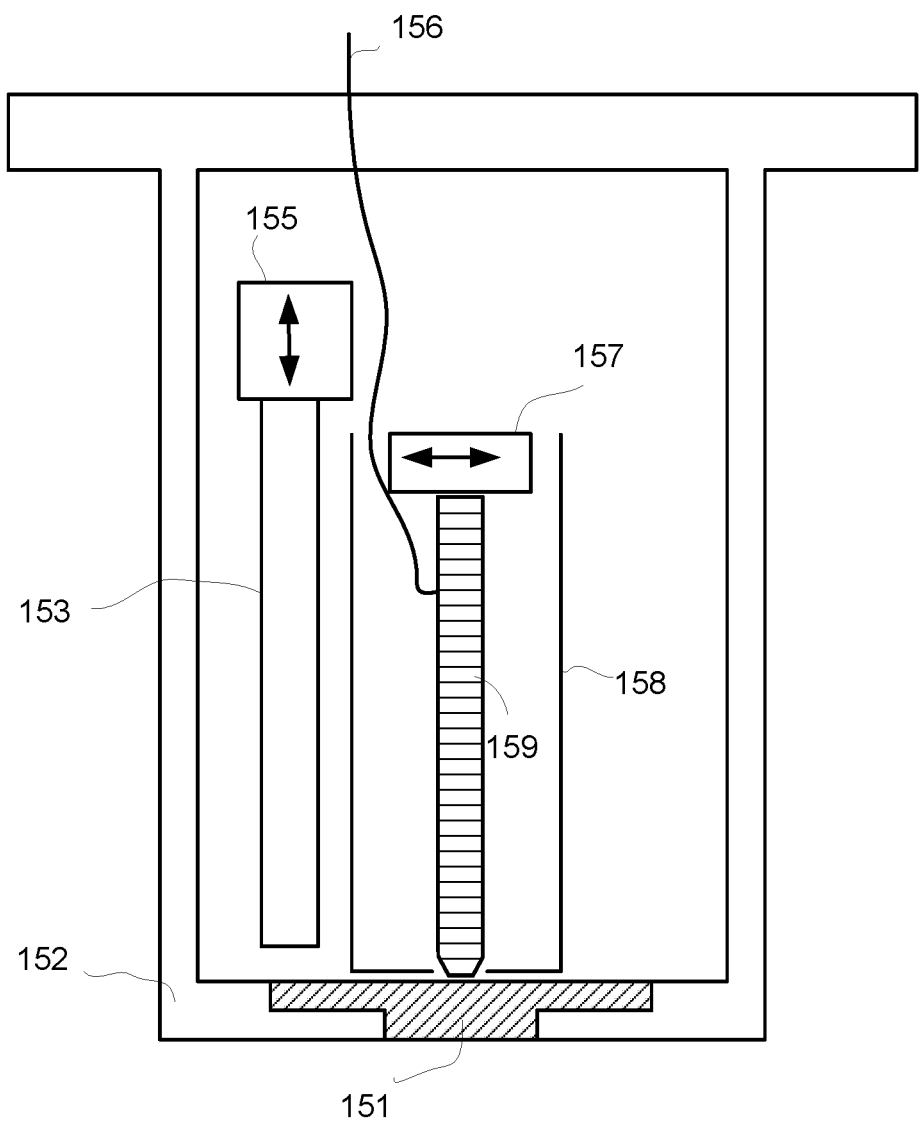
FIG. 3 illustrates an example of an electrostatic sensor.

FIG. 3 illustrates a cross section of the electrostatic sensor 150.

The electrostatic sensor 150 includes a conductive seal 151, a sealed housing 152, a movable grounding element 153, a first mechanical unit 155 that is configured to move the movable grounding element 153, a conductor 156, a second mechanical unit 157 that is configured to move the sensing element, a sensing element such as Kelvin probe 159, and an inner mask 158.

The inductive seal 151 is sealingly connected to the sealed housing 152 in order to isolate the interior of the electrostatic sensor 150—especially the Kelvin probe 159, the first mechanical unit 155 and the second mechanical unit 157 from the inner space of the vacuumed chamber—to prevent contamination of the wafer.

It should be noted that the first mechanical unit 155 may be located outside the electrostatic sensor 150.

The second mechanical unit 157 may vibrate and, additionally or alternatively, oscillate the Kelvin probe during any charge measurement.

The movable grounding element 153 may be moved (by the first mechanical unit 155) between (a) a grounding position in which the movable grounding element is electrically coupled to the sensing element, and (b) a disconnected position in which the movable grounding element is not electrically coupled to the sensing element.

Evaluating a Contact Between a Wafer and an Electrostatic Chuck

Figure 4:
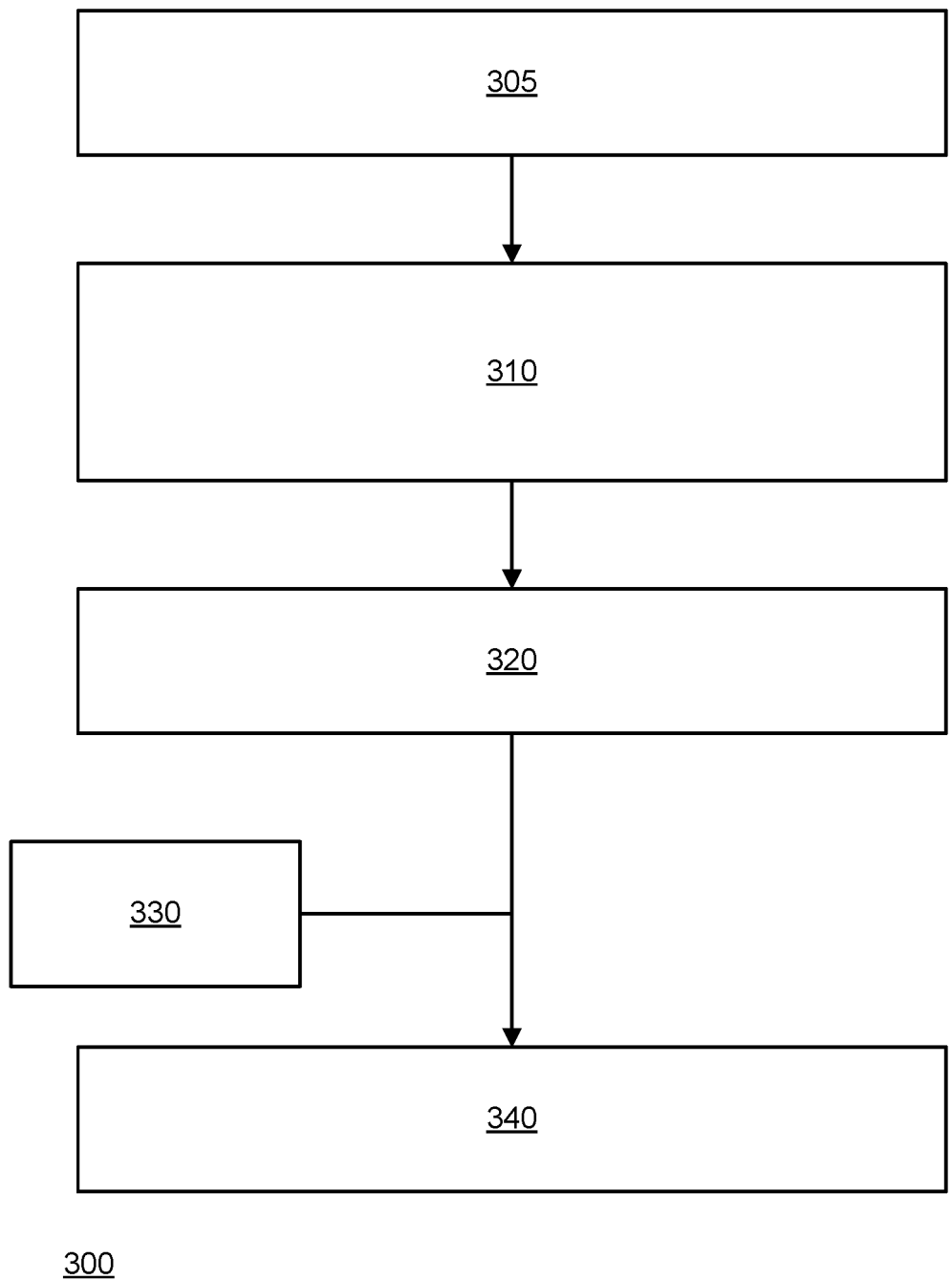
FIG. 4 illustrates an example of a method.

FIG. 4 illustrated a method 300 for evaluating a contact between a wafer and an electrostatic chuck.

Method 300 may start by initialization step 305.

Initialization step 305 may include placing the wafer on an electrostatic chuck of a charged particle system.

Initialization step 305 may also include positioning one or more conductive contact pins (or other conducting elements) of the electrostatic chuck at a position in which they are supposed to contact the wafer. For example, if the pins should contact the wafer when positioned at an upper position, then the pins are positioned at the upper position.

Initialization step 305 may be followed by step 310 of introducing a voltage difference between an absolute value of a negative pole of the electrostatic chuck and an absolute value of a positive pole of the electrostatic chuck.

The voltage difference may be abrupt, for example, introducing a change of a few tens of volts within a period of time of a millisecond scale duration (for example between 1 and 90 milliseconds).

Initialization step 305 may also be followed by step 320 of monitoring, by an electrostatic sensor, a charge at a point of measurement located at a front side of the wafer, at different points of time that follow a start of the introduction of the voltage difference. The outcome of step 320 is monitoring results.

The electrostatic sensor may be any of the mentioned above electrostatic sensors.

For example—the electrostatic sensor may include a sensing element that is sealed from an inner space of a vacuumed chamber of a charged particle system. The sensing element may be a Kelvin probe. The electrostatic sensor may include a mechanical unit for moving the Kelvin probe during the charge measurements. The electrostatic sensor may include a conductive sealing element that seals the sensing element. The electrostatic sensor may include a movable grounding element that is configured to move between a grounding position in which the movable grounding element is electrically coupled to the sensing element, and a disconnected position in which the movable grounding element is not electrically coupled to the sensing element.

Method 300 may also include step 330 of obtaining an estimate of a capacitance of a virtual capacitor formed by the wafer and the electrostatic chuck.

Step 330 may include measuring the capacitance by a capacitance electrostatic sensor, or otherwise receiving the estimated capacitance.

Steps 320 and 330 may be followed by step 340 of determining an electrical parameter of the contact between the wafer and the electrostatic chuck, based on the monitoring results.

The electrical parameter may be a resistance of the contact. As the wafer may be contacted at multiple locations by multiple conductive pins, the resistance of the contact represents the overall impact of the multiple conductive pins. In other words, the resistance may represent a virtual resistor formed between the wafer and the electrostatic chuck.

The introduction of the voltage difference may be seen as charging a resistor-capacitor circuit, and the charge pattern formed over time may represent a discharge (unless the wafer is completely disconnected from the electrostatic chuck) of the resistor-capacitor circuit.

Accordingly, step 340 may include approximating a charge pattern represented by the monitoring results to a discharge curve of a resistor-capacitor circuit.

The voltage difference may be abrupt, for example be at a rate of at least 1 volt per millisecond.

Figure 5:
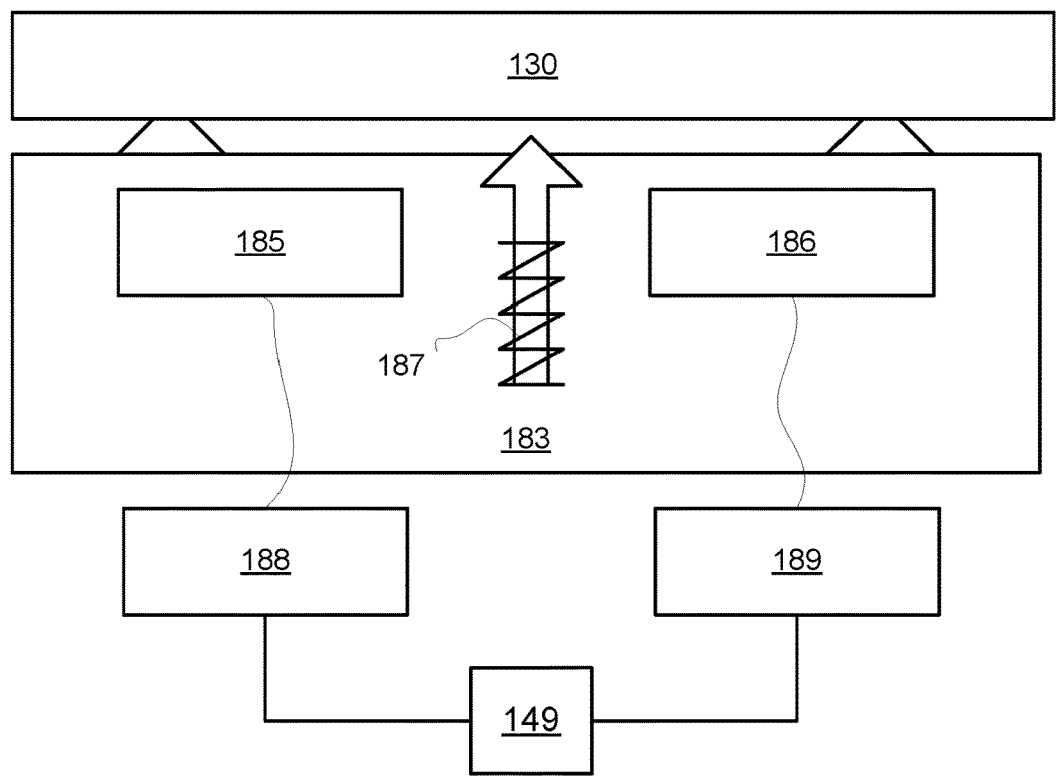
FIG. 5 illustrates an example of a wafer and some parts of a charged particle system.

FIG. 5 illustrates an example of an electrostatic chuck 183, a wafer 130, a controller 149, a positive supply source 188, and a negative supply source 189.

The wafer 130 is supported by the electrostatic chuck 183. The electrostatic chuck 183 includes a positive pole 185, a negative pole 186, and one or more conductive contact pins 187 that can move towards the wafer 130 or away from the wafer.

Positive pole 185 is fed by positive supply source 188. Negative supply source 189 feeds negative pole 186.

The controller 149 may control the supply of the voltages by any of the supply sources.

Figure 6:
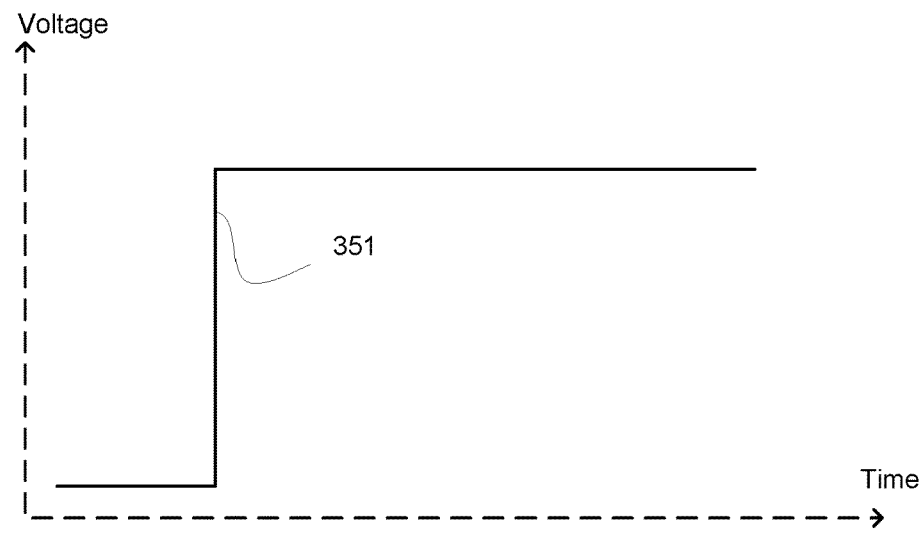
FIG. 6 illustrates an example of an introduction of a voltage difference.
Figure 6:
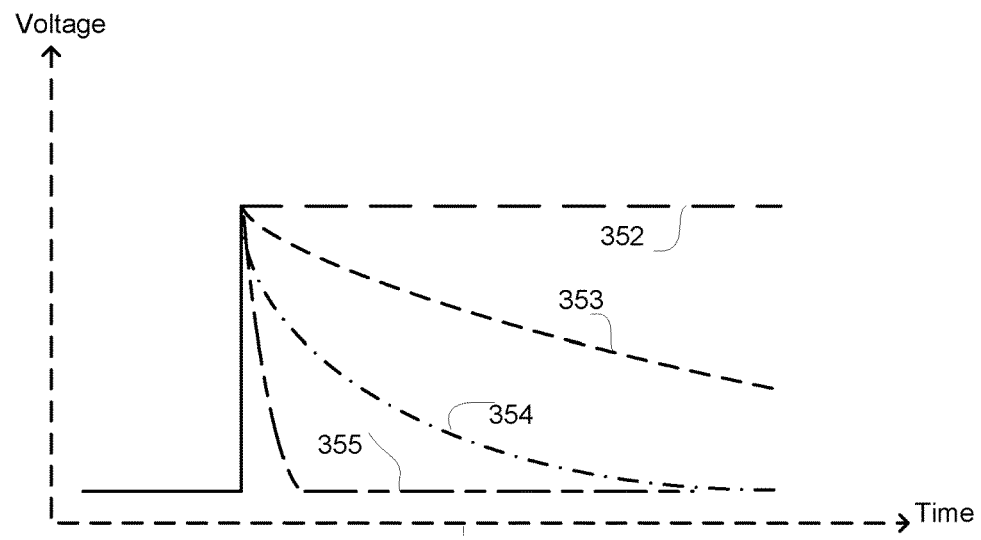

FIG. 6 illustrates an introduction of a voltage difference between an absolute value of a negative pole of the electrostatic chuck and an absolute value of a positive pole of the electrostatic chuck.

FIG. 6 includes graph 359 and graph 358. The x-axis is time while the y-axis represents voltage readings of the electrostatic sensor.

Graph 358 includes a curve 351 illustrating step function 351, the introduction of a voltage difference.

Graph 359 illustrates the response to the introduction of the voltage difference.

Charge pattern 352 follows the step function and represents a complete disconnection between the electrostatic chuck and the wafer.

Charge patterns 353, 354, 354 and 355 illustrate charge patterns obtained for different resistance values between the electrostatic chuck and the wafer, for example, fifty Mega-Ohm, ten Mega-Ohm, and one Maga-Ohm, respectively. The capacitance was ten nano-Farad.

Predicting a Jump of a Wafer

Figure 7:
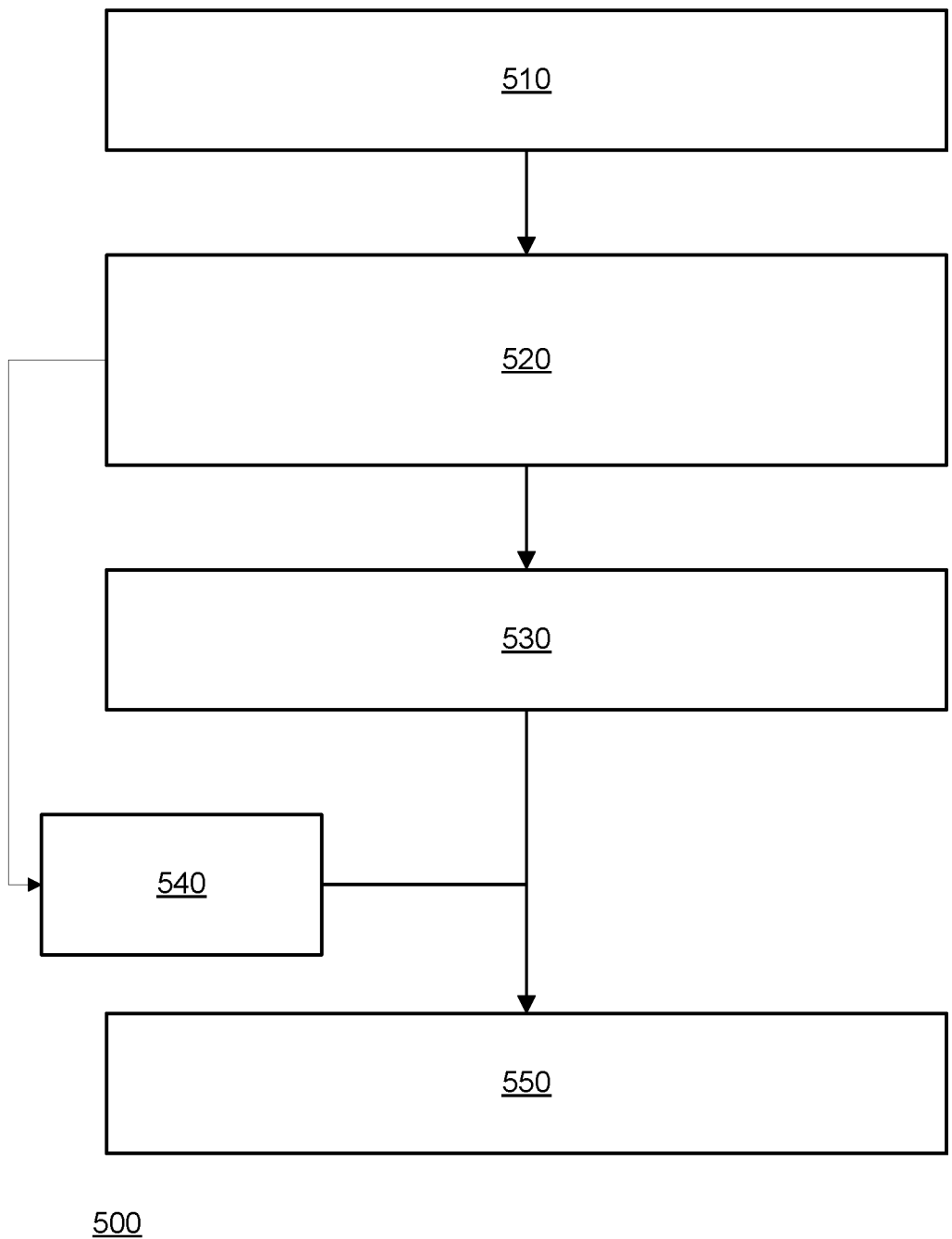
FIG. 7 illustrates an example of a method.

FIG. 7 illustrates an example of a method 500 for predicting a jump of a wafer.

Method 500 may start by step 510 of obtaining a predictor that predicts whether the wafer will jump as a result of an increase in a distance between the wafer and a mechanical stage of an evaluation system.

The predictor may be generated based on changes in voltages of wafers under different connectivity conditions between the wafer and the evaluation system. The changes are induced by changing the distance between the wafer and the mechanical stage.

The predictor may refer to a pattern in which the voltage measured by the electrostatic sensor change. For example, the predictor may refer to a change rate of the voltage, to a range of voltages in which the voltage changes, and the like.

The different connectivity conditions may refer to connections that differ from each other by conductivity. The conductivity may be affected from various parameters—for example the spatial relationship between the wafer and the mechanical stage (for example whether the wafer was parallel to the mechanical stage, whether the wafer was warped, the minimal distance between the wafer and the mechanical stage), the presence or absence of discharging paths to the wafer, and the like.

Step 510 may be followed by step 520 of monitoring a voltage of an area of the wafer, by an electrostatic sensor.

The electrostatic sensor may be any of the mentioned above electrostatic sensors.

The electrostatic sensor may include a sensing element that is sealed from an inner space of a vacuumed chamber of a charged particle system. The sensing element may be a Kelvin probe. The electrostatic sensor may include a mechanical unit for moving the Kelvin probe during the charge measurements. The electrostatic sensor may include a conductive sealing element that seals the sensing element. The electrostatic sensor may include a movable grounding element that is configured to move between a grounding position in which the movable grounding element is electrically coupled to the sensing element, and a disconnected position in which the movable grounding element is not electrically coupled to the sensing element.

The monitoring occurs during a monitoring period in which the distance between the wafer and the mechanical stage is increased, the monitoring provides a monitoring result.

Step 520 may be followed by step 530 of predicting whether the wafer will jump, wherein the predicting is based on the predictor and the monitoring result.

Step 520 may also be followed by step 540 of predicting a timing of an occurrence of an electrical arc between the wafer and a measurement system.

Either one of steps 530 and 540 may be followed by step 550 of responding to the prediction.

Step 550 may include generating an alert, stopping the increment of the distance between the wafer and the mechanical stage before the predicted timing of occurrence of the electrical arc, or performing any other response.

Figure 8:
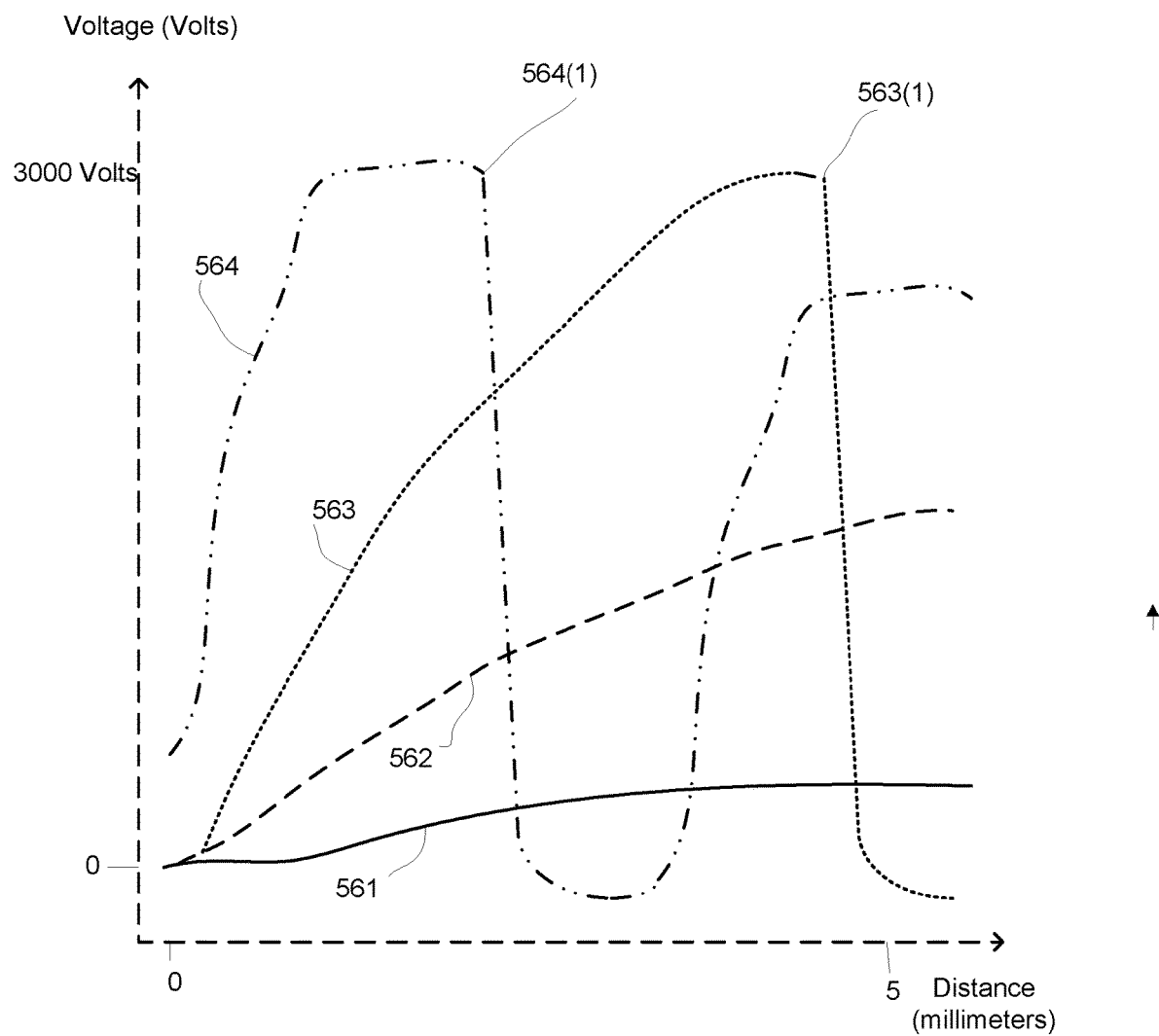
FIG. 8 illustrates an example of voltage per distance relationships.

FIG. 8 illustrates examples of voltage per distance relationships—as illustrated a by first curve 561, second curve 562, third curve 563 and fourth curve 564.

First curve 561 and second curve 562 represent cases in which the wafer did not jump.

Third curve 563 and fourth curve 564 illustrate cases in which the wafer jumped and an arc was formed (are event 564(1) and arc 564(2)) between the wafer and its surroundings. Each arc discharged the wafer.

Figure 9:
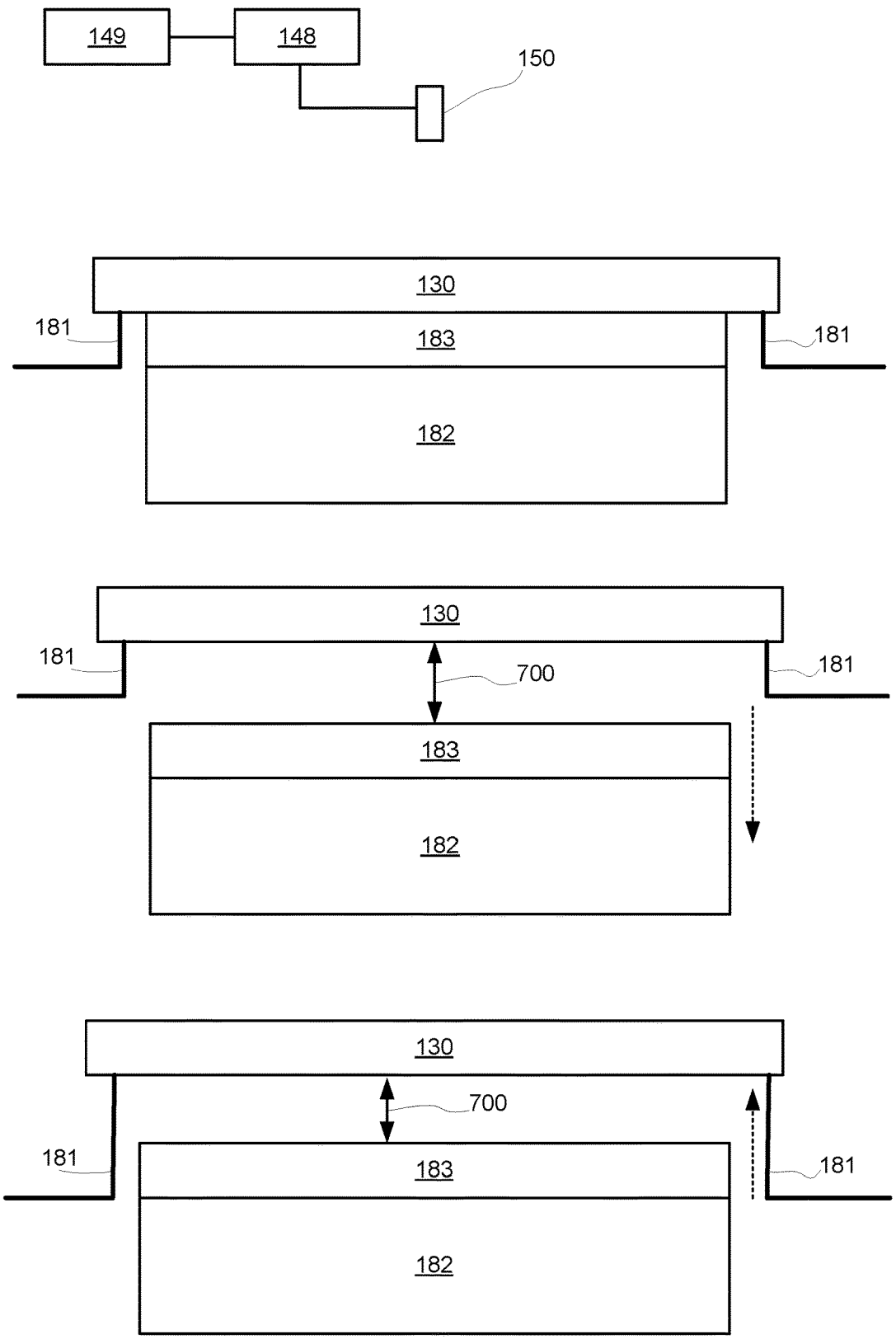
FIG. 9 illustrates an example of introducing distances between the wafer and the mechanical stage.

FIG. 9 illustrates examples in which the distance 700 between the wafer and the mechanical stage were incremented.

The upper part of FIG. 9 illustrates wafer 130 supported by pins 181 and by electrostatic chuck 183. The electrostatic chuck 183 is supported by mechanical stage 182.

The middle part of FIG. 2 illustrates that a distance 700 is introduced between wafer 130 and the electrostatic chuck 182 by lowering the mechanical stage 182 that supports the electrostatic chuck 183.

The lower part of FIG. 9 illustrates that a distance 700 is introduced between wafer 130 and the electrostatic chuck 183 by elevating pins 181 that in turn elevate the wafer.

There may be provided a method for evaluating a charge distribution of an area of a front side of a wafer, the method may include evaluating the charge distribution of the area, using an electrostatic sensor that may include a sensing element that may be sealed from an inner space of a vacuumed chamber of a charged particle system, the evaluating may include performing charge measurements at different point of measurements within the area.

The sensing element may be Kelvin probe, wherein the electrostatic sensor may include a mechanical unit for moving the Kelvin probe during the charge measurements.

The electrostatic sensor may include a conductive sealing element that seals the Sensing element.

The electrostatic sensor may include a movable grounding element that may be configured to move between a grounding position in which the movable grounding element may be electrically coupled to the Sensing element, and a disconnected position in which the movable grounding element may be not electrically coupled to the sensing element.

The method may include determining at least one evaluation parameter to be used during an evaluation of the area, the determining may be based on the evaluated charge distribution of the area.

The method may include moving the wafer between one location of the different locations to another location of the different locations, wherein the moving may be executed by a mechanical stage of the charged particle system.

There may be provided a device for evaluating a charge distribution of an area of a front side of a wafer, the device may include a processing circuit; and an electrostatic sensor that may include a sensing element that may be sealed from an inner space of a vacuumed chamber of a charged particle system; wherein the electrostatic sensor may be configured to perform charge measurements at different points of measurements within the area, the electrostatic sensor; and wherein the processing circuit may be configured to evaluate the charge distribution of the area based on the charge measurements.

The sensing element may be Kelvin probe, wherein the electrostatic sensor may include a mechanical unit for moving the Kelvin probe during the charge measurements.

The electrostatic sensor may include a conductive sealing element that seals the sensing element.

The electrostatic sensor may include a movable grounding element that may be configured to move between a grounding position in which the movable grounding element may be electrically coupled to the sensing element, and a disconnected position in which the movable grounding element may be not electrically coupled to the sensing element.

The processing circuit may be configured to determine at least one evaluation parameter of the wafer based on the evaluated charge distribution of the area.

There may be provided a non-transitory computer readable medium for evaluating a charge distribution of an area of a front side of a wafer, the non-transitory computer readable medium stores instructions for evaluating the charge distribution of the area, using an electrostatic sensor that may include a sensing element that may be sealed from an inner space of a vacuumed chamber of a charged particle system, the evaluating may include performing charge measurements at different points of measurements within the area.

There may be provided a method for predicting a jump of a wafer, the method may include obtaining a predictor that predicts whether the wafer will jump as a result of an increase in a distance between the wafer and a mechanical stage of an charged particle system; wherein the predictor may be generated based on changes in voltages of wafers under different connectivity conditions between the wafer and the charged particle system, the changes may be induced by changing the distance between the wafer and the mechanical stage; monitoring a voltage of an area of the wafer, by an electrostatic sensor that may include a sensing element, wherein the monitoring occurs during a monitoring period in which the distance between the wafer and the mechanical stage may be increased, the monitoring provides a monitoring result; and predicting whether the wafer will jump, wherein the predicting may be based on the predictor and the monitoring result.

The method may include predicting a timing of an occurrence of an electrical arc between the wafer and a measurement system.

The method may include stopping an increment of the distance between the wafer and the mechanical stage before a predicted timing of occurrence of the electrical arc.

The predictor may be a rate of voltage increment per distance increment.

The method may include generating the predictor.

The sensing element may be Kelvin probe, wherein the electrostatic sensor may include a mechanical unit for moving the Kelvin probe during the monitoring.

The electrostatic sensor may include a conductive sealing element that seals the sensing element.

The electrostatic sensor may include a movable grounding element that may be configured to move between a grounding position in which the movable grounding element may be electrically coupled to the Sensing element, and a disconnected position in which the movable grounding element may be not electrically coupled to the sensing element.

There may be provided a device for predicting a jump of a wafer, the device may include a processing circuit; and an electrostatic sensor that may include a sensing element; wherein the electrostatic sensor may be configured to monitor a voltage of an area of the wafer, wherein the monitoring occurs during a monitoring period in which a distance between the wafer and a mechanical stage may be increased, the mechanical stage belongs to a charged particle system, the monitoring provides a monitoring result; wherein the processing circuit may be configured to obtain a predictor that predicts whether the wafer will jump as a result of an increase in the distance between the wafer and the mechanical stage; wherein the predictor may be generated based on changes in voltages of wafers under different connectivity conditions between the wafer and the charged particle system, the changes may be induced by changing the distance between the wafer and the mechanical stage; and predict whether the wafer will jump, wherein the predicting may be based on the predictor and the monitoring result.

The processing circuit may be configured to predict a timing of an occurrence of an electrical arc between the wafer and a measurement system.

The processing circuit may be configured to request to stop an increment of the distance between the wafer and the mechanical stage before a predicted timing of occurrence of the electrical arc.

The predictor may be a rate of voltage increment per distance increment.

The processing circuit may be configured to generate the predictor.

The sensing element may be Kelvin probe, wherein the electrostatic sensor may include a mechanical unit for moving the Kelvin probe during the monitoring.

The electrostatic sensor may include a conductive sealing element that seals the sensing element.

The electrostatic sensor may include a movable grounding element that may be configured to move between a grounding position in which the movable grounding element may be electrically coupled to the Sensing element, and a disconnected position in which the movable grounding element may be not electrically coupled to the sensing element.

There may be provided a non-transitory computer readable medium for predicting a jump of a wafer, the non-transitory computer readable medium stores instructions for obtaining a predictor that predicts whether the wafer will jump as a result of an increase in a distance between the wafer and a mechanical stage of an charged particle system; wherein the predictor may be generated based on changes in voltages of wafers under different connectivity conditions between the wafer and the charged particle system, the changes may be induced by changing the distance between the wafer and the mechanical stage; monitoring a voltage of an area of the wafer, by an electrostatic sensor that may include a sensing element, wherein the monitoring occurs during a monitoring period in which the distance between the wafer and the mechanical stage may be increased, the monitoring provides a monitoring result; and predicting whether the wafer will jump, wherein the predicting may be based on the predictor and the monitoring result.

Any of the mentioned above relationships may be learnt in any manner. For example—reference structural elements with recesses of known dimensions may be illuminated to provide measurements results that are associated with the known dimensions of the recesses.

Additionally or alternatively, the relationship may be learnt from simulating the electron images obtained when scanning the structural elements.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A method for evaluating a contact between a wafer and an electrostatic chuck, the method comprising:
   introducing, while the wafer is supported by the electrostatic chuck and is contacted by one or more conductive contact pins of the electrostatic chuck, a voltage difference between an absolute value of a negative pole of the electrostatic chuck coupled to a negative voltage source and an absolute value of a positive pole of the electrostatic chuck coupled to a positive voltage source;
   monitoring, by an electrostatic sensor that comprises a sensing element, a charge at a point of measurement located at a front side of the wafer, at different points of time that follow a start of the introducing of the voltage difference, to provide monitoring results; and
   determining an electrical parameter of the contact between the wafer and the electrostatic chuck, based on the monitoring results.

2. The method according to claim 1 wherein the determining of the electrical parameter comprises determining a resistance of the contact.

3. The method according to claim 2 wherein the determining of the resistance of the contact comprises approximating a charge pattern represented by the monitoring results to a discharge curve of a resistor-capacitor circuit.

4. The method according to claim 1 wherein the introducing of the voltage difference comprises introducing a voltage difference at rate of at least one volt per 1 milliseconds.

5. The method according to claim 1 wherein the sensing element is Kelvin probe, wherein the electrostatic sensor comprises a mechanical unit for moving the Kelvin probe during the charge measurements.

6. The method according to claim 1 wherein the electrostatic sensor further comprises a conductive sealing element that seals the sensing element.

7. The method according to claim 1 wherein the electrostatic sensor further comprises a movable grounding element that is configured to move between a grounding position in which the movable grounding element is electrically coupled to the Sensing element, and a disconnected position in which the movable grounding element is not electrically coupled to the sensing element.

8. A device for evaluating a contact between a wafer and an electrostatic chuck, the device comprises:
   a processing circuit; and
   an electrostatic sensor that comprises a sensing element;
   wherein the electrostatic sensor is configured to monitor a charge at a point of measurement located at a front side of the wafer, at different points of time that follow a start of an introduction of a voltage difference between an absolute value of a negative pole of the electrostatic chuck coupled to a negative voltage source and an absolute value of a positive pole of the electrostatic chuck coupled to a positive voltage source, wherein the introduction occurs while the wafer is supported by the electrostatic chuck and is contacted by one or more conductive contact pins of the electrostatic chuck; and
   wherein the processing circuit is configured to determine an electrical parameter of the contact between the wafer and the electrostatic chuck, based on an outcome of a monitoring of the charge.

9. The device according to claim 8 wherein the processing circuit is configured to determine an electrical parameter of the contact by determining a resistance of the contact.

10. The device according to claim 9 wherein the determining of the resistance of the contact comprises approximating a charge pattern represented by the outcome of the monitoring of the charge to a discharge curve of a resistor-capacitor circuit.

11. The device according to claim 8 wherein the voltage difference is introduced at a rate of at least one volt per 1 milliseconds.

12. The device according to claim 8 wherein the sensing element is Kelvin probe, wherein the electrostatic sensor comprises a mechanical unit for moving the Kelvin probe during the charge measurements.

13. The device according to claim 8 wherein the electrostatic sensor further comprises a conductive sealing element that seals the sensing element.

14. The device according to claim 8 wherein the electrostatic sensor further comprises a movable grounding element that is configured to move between a grounding position in which the movable grounding element is electrically coupled to the Sensing element, and a disconnected position in which the movable grounding element is not electrically coupled to the sensing element.

15. A non-transitory computer readable medium for evaluating a contact between a wafer and an electrostatic chuck, the non-transitory computer readable medium stores instructions for:

introducing, while the wafer is supported by the electrostatic chuck and is contacted by one or more conductive contact pins of the electrostatic chuck, a voltage difference between an absolute value of a negative pole of the electrostatic chuck coupled to a negative voltage source and an absolute value of a positive pole of the electrostatic chuck coupled to a positive voltage source;

monitoring, by an electrostatic sensor that comprises a sensing element, a charge at a point of measurement located at a front side of the wafer, at different points of time that follow a start of an introducing of the voltage difference, to provide monitoring results; and determining an electrical parameter of the contact between the wafer and the electrostatic chuck, based on the monitoring results.

16. The non-transitory computer readable medium according to claim 15 wherein the determining of the electrical parameter comprises determining a resistance of the contact.

17. The non-transitory computer readable medium according to claim 16 wherein the determining of the resistance of the contact comprises approximating a charge pattern represented by the monitoring results to a discharge curve of a resistor-capacitor circuit.

18. The non-transitory computer readable medium according to claim 15 wherein the sensing element is Kelvin probe, wherein the electrostatic sensor comprises a mechanical unit for moving the Kelvin probe during the charge measurements.

19. The non-transitory computer readable medium according to claim 15 wherein the electrostatic sensor further comprises a conductive sealing element that seals the sensing element.

20. The non-transitory computer readable medium according to claim 15 wherein the electrostatic sensor further comprises a movable grounding element that is configured to move between a grounding position in which the movable grounding element is electrically coupled to the Sensing element, and a disconnected position in which the movable grounding element is not electrically coupled to the sensing element.

21. The method of claim 1 further comprising, prior to the introducing step:

supporting the wafer on an electrostatic chuck in a vacuum chamber and moving the electrostatic chuck within the vacuum chamber by a mechanical stage; and contacting the wafer with one or more conductive contact pins of the electrostatic chuck.

22. The device set forth in claim 8 wherein the device is part of a charged particle system configured to evaluate a wafer or a portion of a wafer, the charged particle system comprising:

a charged particle column configured to generate a charged particle beam;

a vacuum chamber;

an electrostatic chuck configured to support a wafer within the vacuum chamber, wherein the electrostatic chuck comprises a negative pole, a positive pole and a plurality of conductive contact pins operable to contact a back surface of a wafer supported by the electrostatic chuck; and a mechanical stage configured to move the electrostatic chuck within the vacuum chamber.

\* \* \* \* \*